(12) United States Patent
Patra et al.

(10) Patent No.: US 9,791,784 B2
(45) Date of Patent: Oct. 17, 2017

(54) ASSEMBLY FOR A PROJECTION EXPOSURE APPARATUS FOR EUV PROJECTION LITHOGRAPHY

(71) Applicant: Carl Zeiss SMT GmbH, Oberkochen (DE)

(72) Inventors: Michael Patra, Oberkochen (DE); Stig Bieling, Aalen (DE); Markus Deguenther, Aalen (DE); Johannes Wangler, Koenigsbronn (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 423 days.

(21) Appl. No.: 14/516,250

(22) Filed: Oct. 16, 2014

(65) Prior Publication Data

US 2015/0062549 A1    Mar. 5, 2015

Related U.S. Application Data

(63) Continuation of application No. PCT/EP2013/058868, filed on Apr. 29, 2013.
(Continued)

(30) Foreign Application Priority Data

May 11, 2012    (DE) .................. 10 2012 207 866

(51) Int. Cl.
*G03B 27/54*      (2006.01)
*G03F 7/20*       (2006.01)
(Continued)

(52) U.S. Cl.
CPC ........... *G03F 7/702* (2013.01); *G02B 5/0891* (2013.01); *G02B 5/09* (2013.01); *G02B 26/0833* (2013.01);
(Continued)

(58) Field of Classification Search
CPC .......... G02B 26/0833–26/0866; G02B 5/0891; G02B 5/09; G03F 7/70075;
(Continued)

(56) References Cited

U.S. PATENT DOCUMENTS 5,636,005 A  *  6/1997  Yasuzato ............ G03F 7/70066
                                                250/548
6,438,199 B1      8/2002  Schultz et al.
(Continued)

FOREIGN PATENT DOCUMENTS

DE   10 2009 030 501 A1   1/2011
EP      1 225 481 A2      7/2002
(Continued)

OTHER PUBLICATIONS

German Office Action, with translation thereof, for DE Appl No. 10 2012 207 866.5, dated Dec. 19, 2102.
(Continued)

*Primary Examiner* — Christina Riddle
(74) *Attorney, Agent, or Firm* — Fish & Richardson P.C.

(57) ABSTRACT

An assembly for a projection exposure apparatus for EUV projection lithography has an illumination optical unit for guiding illumination light to an illumination field, in which a lithography mask can be arranged. The illumination optical unit comprises a first facet mirror, which comprises a plurality of mirror arrays with respectively a plurality of individual mirrors. The individual mirrors provide individual mirror illumination channels for guiding illumination light partial beams to the illumination field. The mirror arrays of the first facet mirror are arranged in an array superstructure. Gaps extend along at least one main direction (HRα) between neighboring ones of the mirror arrays. Furthermore, the illumination optical unit comprises a second facet mirror, which comprises a plurality of facets,
(Continued)

which respectively contribute to imaging a group of the individual mirrors of the field facet mirror into the illumination field via a group mirror illumination channel.

20 Claims, 6 Drawing Sheets

Related U.S. Application Data (60) Provisional application No. 61/645,664, filed on May 11, 2012.

(51) Int. Cl.
  *G02B 26/08* (2006.01)
  *G02B 5/08* (2006.01)
  *G02B 5/09* (2006.01)

(52) U.S. Cl.
  CPC ...... *G03F 7/70075* (2013.01); *G03F 7/70083* (2013.01); *G03F 7/70116* (2013.01)

(58) Field of Classification Search
  CPC ............. G03F 7/70091; G03F 7/70116; G03F 7/70083; G03F 7/7015; G03F 7/702; G03F 7/70141; G03F 7/70391
  USPC ...... 355/52, 53, 55, 67–71, 75–77; 359/359, 359/846, 850, 855, 857–859, 862–863, 359/865, 868, 869, 201.2, 853, 866, 872; 250/492.1, 492.2, 492.22, 492.23, 493.1, 250/503.1, 505.1, 548; 430/5
  See application file for complete search history.

(56) References Cited

U.S. PATENT DOCUMENTS

| | | | |
|---|---|---|---|
| 6,658,084 B2 | 12/2003 | Singer | |
| 6,859,515 B2 | 2/2005 | Schultz et al. | |
| 7,268,856 B2 * | 9/2007 | Shirota | G02B 26/0833 355/67 |
| 2003/0053217 A1 * | 3/2003 | Mori | G03F 7/70075 359/619 |
| 2003/0214644 A1 * | 11/2003 | Shirota | G03F 7/70283 355/67 |
| 2005/0057812 A1 * | 3/2005 | Raber | G02B 17/0896 359/619 |
| 2008/0013680 A1 | 1/2008 | Singer et al. | |
| 2011/0001947 A1 * | 1/2011 | Dinger | G02B 26/06 355/67 |
| 2011/0235015 A1 | 9/2011 | Dengel et al. | |
| 2012/0147347 A1 | 6/2012 | Mann et al. | |

FOREIGN PATENT DOCUMENTS

| | | |
|---|---|---|
| EP | 1 293 834 A2 | 3/2003 |
| WO | WO 2009/100 856 A1 | 8/2009 |

OTHER PUBLICATIONS

International Search Report for corresponding PCT APpl No. PCT/EP2013/058868, dated Aug. 30, 2013.

* cited by examiner

ASSEMBLY FOR A PROJECTION EXPOSURE APPARATUS FOR EUV PROJECTION LITHOGRAPHY

CROSS-REFERENCE TO RELATED APPLICATIONS

The present application is a continuation of, and claims benefit under 35 USC 120 to, international application PCT/EP2013/058868, filed Apr. 29, 2013, which claims benefit under 35 USC 119 of German Application No. 10 2012 207 866.5, filed May 11, 2012. International application PCT/EP2013/058868 also claims priority under 35 USC 119(e) to U.S. Provisional Application No. 61/645,664, filed May 11, 2012. The entire disclosure of international application PCT/EP2013/058868 and German Application No. 10 2012 207 866.5 are incorporated by reference herein.

The invention relates to an assembly for a projection exposure apparatus for EUV projection lithography. Furthermore, the invention relates to a projection exposure apparatus with such an assembly, a method for producing a microstructured or nanostructured component, in particular a semiconductor chip, with the aid of such a projection exposure apparatus and a microstructured or nanostructured component produced via this method.

An illumination optical unit of the type mentioned at the outset is known from US 2011/0001947 A1. Assemblies for projection exposure apparatuses are known from US 2011/0 235 015 A1 and DE 10 2009 030 501 A1.

It is an object of the present invention to develop an assembly of the type mentioned at the outset in such a way that gaps between the mirror arrays, if anything, have small negative effects on the homogeneity of an illumination of the illumination field via the illumination optical unit.

According to the invention, this object is achieved by an assembly for a projection exposure apparatus for EUV projection lithography
  with an illumination optical unit for guiding illumination light to an illumination field, in which a lithography mask can be arranged,
  wherein the illumination optical unit comprises:
    a first facet mirror,
      which comprises a plurality of mirror arrays with respectively a plurality of individual mirrors which provide individual mirror illumination channels for guiding illumination light partial beams to the illumination field,
      wherein the mirror arrays of the first facet mirror are arranged in an array superstructure,
      wherein gaps extend along at least one main direction between neighboring ones of the mirror arrays,
    a second facet mirror, which is arranged downstream of the first facet mirror in the beam path of the illumination light and comprises a plurality of facets, which respectively contribute to imaging a group of the individual mirrors of the field facet mirror into the illumination field via a group mirror illumination channel, wherein the images of the individual mirrors complement one another in the illumination field to form the whole illumination field,
  with a projection optical unit for imaging an object field, which is arranged in the illumination field, into an image field,
  with an object holder for holding the lithography mask in the object field, which object holder can be displaced along a displacement direction via an object displacement drive,
  wherein for the at least one main direction, which includes a smallest angle with the displacement direction, the angle is in the range between 20° and 44°.

What was initially identified is that, for making the illumination of the illumination field more homogeneous, it is advantageous to prescribe a smallest angle between the main direction of the gaps between neighboring mirror arrays and the displacement direction, which angle is greater than 0. A surprising discovery continuing from this was the fact that it is not a 45° orientation of the main direction of the gaps to the displacement direction that brings about the greatest homogenization effect, but rather that it is substantially advantageous to select a smallest angle between the main direction of the gaps and the displacement direction, which lies in the range between 20° and 44°. This ensures that the gap effects during scanning of the respective object point on the lithography mask average through the object field in such a way that good scan-integrated homogenization of the illumination of each object point, when the latter is displaced through the whole object field, is ensured. A width of the gaps between the neighboring mirror arrays is significantly greater than the distance between two neighboring individual mirrors within respectively one of the mirror arrays. The images of the individual mirrors complement one another in the illumination field to form the whole illumination field in such a way that every individual mirror image constitutes its own illumination field section. The illumination field sections of the respective individual mirror images do not overlap in the case of perfect imaging in the illumination field, but rather have a distance from one another, which, true to the imaging scale, corresponds to the distance of the individual mirrors from one another.

For the purposes of targeted illumination of a given second facet mirror by a given individual mirror of the first facet mirror, the individual mirrors can be designed to be tiltable about one axis or about two axes. Here, the individual mirrors can be tiltable in such a way that, proceeding from an untilted neutral position, they can be tilted in both directions about the respective tilt axis by a predetermined tilt angle. Angular ranges, in which the smallest angle between the main direction and the displacement direction lies in the range between 30° and 44°, in which the smallest angle between the main direction and the displacement direction lies in the range between 35° and 40°, and in which the smallest angle between the main direction and the displacement direction lies in the range of 37°, have been found to be particularly advantageous for homogenizing the illumination.

An extent ratio, in which an extent of the individual mirror group perpendicular to the scanning direction is not an integer multiple of a maximum extent of the mirror arrays perpendicular to the scanning direction, ensures that there is no undesired resonance effect between the extent of the mirror array perpendicular to the scanning direction and the extent of the individual mirror groups. Avoiding an integer extent ratio improves the averaging effect, since not all individual mirror groups are pervaded in exactly the same way by gaps between the mirror arrays.

A curved group reflection surface, in which the individual mirrors of respectively one of the individual mirror groups have a tiltable design and are arranged in such a way that they form an overall curved group reflection surface in an untilted neutral position, enables an extent of the predetermined regions in an arrangement plane of the second facet mirror with smallest possible tilt angles for the individual mirrors. Joints of the individual mirrors can then advantageously be designed with a high thermal transmission capacity such that heat, which, in particular, is deposited on the individual mirrors by a residual absorption of the illumination light thereon, can be dissipated in an effective manner. Even in the case of an overall curved group reflection surface, the individual individual-mirrors can respectively have non-curved, i.e. planar, reflection surfaces.

The advantages of a projection exposure apparatus
with an assembly according to the invention,
with an EUV light source,
with a wafer holder for holding a wafer in the image field, which wafer holder can be displaced along the displacement direction via a wafer displacement drive,
and a method for producing a microstructured or nanostructured component, comprising the following method steps:
providing a wafer, onto which a layer made of a light-sensitive material is applied at least in part,
providing a reticle, which has structures to be imaged,
providing a projection exposure apparatus as described above,
projecting at least part of the reticle onto a region of the layer with the aid of a projection optical unit of the projection exposure apparatus,
correspond to those which were already explained above with reference to the assembly according to the invention.

A microstructured or nanostructured component, produced by a method as described above, can be produced with an extremely high structure resolution. By way of example, this makes it possible to produce a semiconductor chip with an extremely high integration or storage density.

Exemplary embodiments of the invention will be explained in more detail below on the basis of the drawing. In detail.

Figure 1:
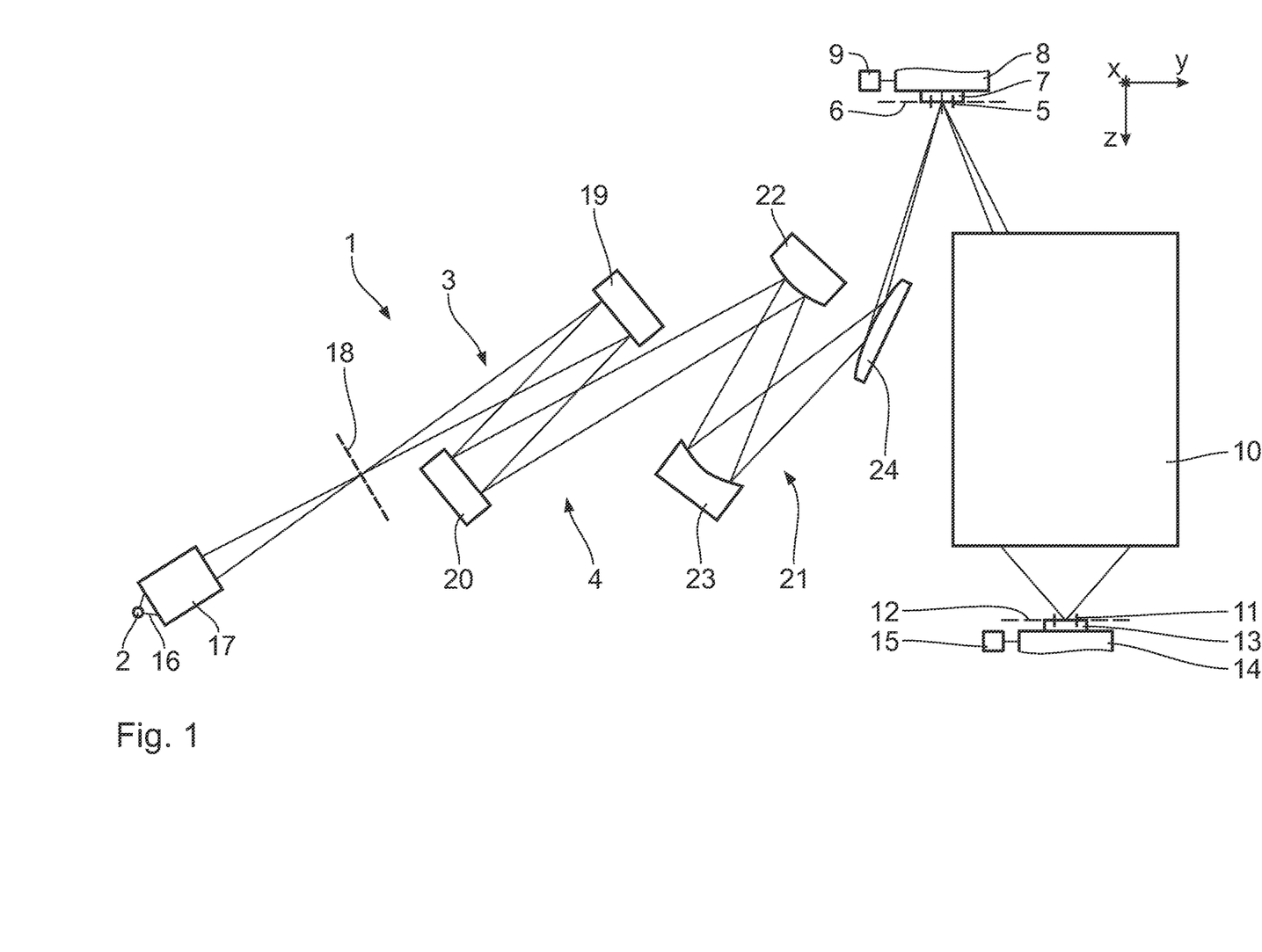
FIG. 1 schematically shows a meridional section through a projection exposure apparatus for EUV projection lithography.

FIG. 1 schematically shows a projection exposure apparatus 1 for micro-lithography in a meridional section. The projection exposure apparatus 1 includes a light or radiation source 2. An illumination system 3 of the projection exposure apparatus 1 comprises an illumination optical unit 4 for exposing an illumination field, which coincides with an object field 5, in an object plane 6. The illumination field can also be larger than the object field 5. What is exposed here is an object in the form of a reticle 7, which is held by an object or reticle holder 8 and is arranged in the object field 5. The reticle 7 is also referred to as lithography mask. The object holder 8 can be displaced along a displacement direction via an object displacement drive 9. A projection optical unit 10 serves for imaging the object field 5 into an image field 11 in an image plane 12. A structure on the reticle 7 is imaged onto a light-sensitive layer of a wafer 13 arranged in the region of the image field 11 in the image plane 12. The wafer 13 is held by a wafer holder 14. The wafer holder 14 can, synchronized to the object holder 8, likewise be displaced along the displacement direction via a wafer displacement drive 15.

The radiation source 2 is an EUV radiation source with an emitted used radiation in the range between 5 nm and 30 nm. Here, this can be a plasma source, for example a GDPP source (gas discharge-produced plasma) or an LPP source (laser-produced plasma). A radiation source which is based on a synchrotron or on a free electron laser (FEL) can also be used as radiation source 2. By way of example, a person skilled in the art finds information in respect of such a radiation source in U.S. Pat. No. 6,859,515 B2. EUV radiation 16, which is emitted by the radiation source 2, is focused by a collector 17. A corresponding collector is known from EP 1 225 481 A. After the collector 17, the EUV radiation 16 propagates through an intermediate focus plane 18, before it is incident on a field facet mirror 19. The field facet mirror 19 is a first facet mirror of the illumination optical unit 4. The field facet mirror 19 has a multiplicity of individual mirrors, which are not illustrated in FIG. 1. The field facet mirror 19 is arranged in a plane of the illumination optical unit 4, which is optically conjugate to the object plane 6.

In the following text, the EUV radiation 16 is also referred to as illumination light or imaging light.

After the field facet mirror 19, the EUV radiation 16 is reflected by a pupil facet mirror 20. The pupil facet mirror 20 is a second facet mirror of the illumination optical unit 4. The pupil facet mirror 20 is arranged in a pupil plane of the illumination optical unit 4, which is optically conjugate to the intermediate focus plane 18 and to a pupil plane of the projection optical unit 10, or coincides with this pupil plane. The pupil facet mirror 20 has a plurality of pupil facets, which are not illustrated in FIG. 1. With the aid of the pupil facets of the pupil facet mirror 20 and a subsequent imaging optical assembly in the form of a transmission optical unit 21 with mirrors 22, 23 and 24, denoted in the sequence of the beam path, individual mirror groups 25 (see FIG. 7), which will still be described in more detail below, of the field facet mirror 19 are imaged into the object field 5. The last mirror 24 of the transmission optical unit 21 is a grazing-incidence mirror.

In order to simplify the description of positional relations, a Cartesian xyz-coordinate system is plotted in FIG. 1 as a global coordinate system for the description of the positional relations of components of the projection exposure apparatus 1 between the object plane 6 and the image plane 12. In FIG. 1, the x-axis extends perpendicular to the plane of the drawing and into the latter. The y-axis extends toward the right in FIG. 1 and parallel to the displacement direction of the object holder 9 and of the wafer holder 14. In FIG. 1, the z-axis extends downward, i.e. perpendicular to the object plane 6 and to the image plane 12.

The x-dimension over the object field 5 or the image field 11 is also referred to as field height.

Figure 2:
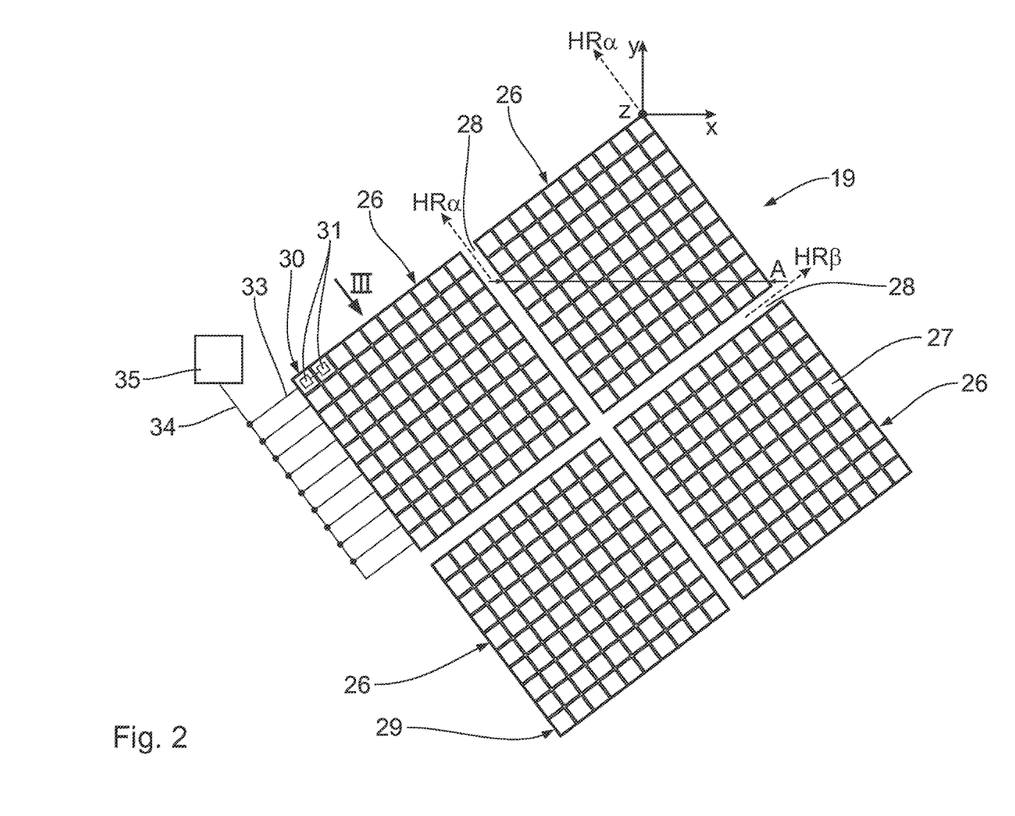
FIG. 2 schematically shows a top view of a section of a field facet mirror, made up of individual mirrors, comprising four mirror arrays, which field facet mirror is designed for use in the projection exposure apparatus according to FIG. 1, wherein a main direction HRα of gaps between neighboring ones of the mirror arrays includes a smallest angle of 37° with a displacement direction y of an object holder of the projection exposure apparatus.

FIG. 2 shows details of the design of a section of the field facet mirror 19 in a very schematic illustration. In order to simplify the description of positional relations, a Cartesian xyz-coordinate system is plotted in FIG. 2 as a local coordinate system of the field facet mirror 19. Corresponding local xyz-coordinate systems or coordinate axes are also found in some of the following figures. The y-direction of the global coordinate system according to FIG. 1, i.e. the displacement direction for the reticle 7 and the wafer 13, and the y-direction of the local coordinate system according to FIG. 2 extend precisely parallel to one another.

An overall reflection surface of the field facet mirror 19 is subdivided into a plurality of mirror arrays 26, of which four mirror arrays 26 are illustrated in FIG. 2. The overall field facet mirror 19 has a multiplicity of such mirror arrays, e.g. approximately 100 of such mirror arrays 26. The mirror arrays 26 are in turn respectively subdivided into rows and columns to form a grid of individual mirrors 27. Each of the mirror arrays 26 is configured as a 10×10 array of individual mirrors 27, i.e. has 100 individual mirrors 27. Partial beams of the illumination light 16 are guided over the respective individual mirrors 27. Perpendicular to the displacement direction y, i.e. along the x-direction, the mirror arrays 26 have a maximum extent which is denoted by A in FIG. 2. The mirror arrays 26 of the field facet mirror 19 are in turn arranged in an array superstructure. FIG. 2 shows a 2×2 array superstructure made of four mirror arrays.

Gaps 28 extend along two mutually perpendicular main directions HRα and HRβ between neighboring ones of the mirror arrays 26. Perpendicular to these main directions HRα, HRβ, the gaps 28 have a transverse extent which is many times larger than a distance between neighboring individual mirrors 27. The main directions HRα, HRβ extend parallel to edges of the square individual mirrors 27. The one of the two main directions HRα, HRβ which includes a smallest angle α with the displacement direction y is the main direction HRα. In the embodiment according to FIG. 2, the angle α is 37°±2°. Depending on the embodiment, this angle α can also be specified with greater precision, e.g. 37°±1° or else 37°±0.1°. The individual reflection surfaces of the individual individual-mirrors 27 are planar and do not have a curvature. An individual mirror row 29 has a plurality of the individual mirrors 27 lying directly next to one another along the main direction HRβ. In the embodiment according to FIG. 2, ten individual mirrors 27 are contained in an individual mirror row 29; however, provision can also be made for several tens to several hundreds of the individual mirrors 27. The individual mirrors 27 are square in the example according to FIG. 2. Other shapes of individual mirrors, which allow occupancy of the reflection surface of the field facet mirror 19 with as few gaps as possible, can also be used. Such alternative individual mirror shapes are known from the mathematical theory of tessellation. In this context, reference is made to the references specified in WO 2009/100 856 A1.

Depending on the embodiment of the field facet mirror 19, an individual mirror column 30 extending along the main direction HRβ likewise has a plurality of the individual mirrors 27. These are likewise ten individual mirrors 27 in the embodiment according to FIG. 2. By way of example, several, several tens or several hundreds of the individual mirrors 27 are provided per individual mirror column 30.

Depending on the embodiment of the field facet mirror 19, the individual mirrors 27 have x/y extents in the range of, for example, from 500 μm×500 μm to, for example, 2 mm×2 mm. The individual mirrors 27 can be shaped in such a way that they have a focusing effect for the illumination light 16. Such a focusing effect of the individual mirrors 27 is particularly advantageous if use is made of a divergent illumination of the field facet mirror 19 by the illumination light 16. The overall reflection surface of the field facet mirror 19 has an extent which, depending on the embodiment, for example is 300 mm×300 mm or 600 mm×600 mm.

Figure 3:
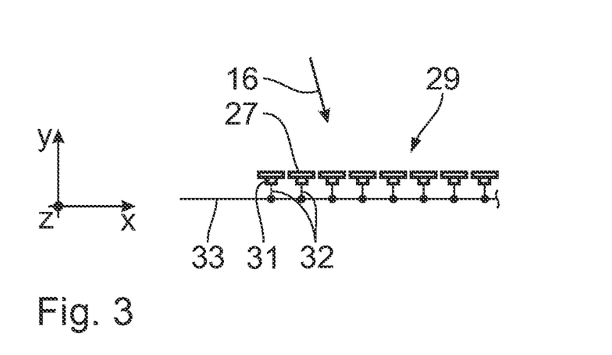
FIG. 3 shows a view of a section of an individual mirror row of the facet mirror according to FIG. 2 from the viewing direction III in FIG. 2.

For the purposes of an individual deflection of incident illumination light 16, each of the individual mirrors 27 is respectively connected to an actuator 31, as indicated in a dashed fashion in FIG. 2 on the basis of two individual mirrors 27 arranged in a left-hand corner of the reflection surface of the field facet mirror 19 and illustrated in more detail in FIG. 3 on the basis of a section of an individual facet row 29. The actuators 31 are arranged on the side of each of the individual mirrors 27 which faces away from a reflecting side of the individual mirrors 27. By way of example, the actuators 31 can be configured as piezo-actuators. Embodiments of such actuators are known from the design of micro-mirror arrays.

The actuators 31 of an individual mirror row 29 are respectively connected to a row signal bus 33 via signal lines 32. One individual mirror row 29 is associated with respectively one of the row signal buses 33. The row signal buses 33 of the individual mirror rows 29 are in turn connected to a main signal bus 34. The latter has a signal connection to a control device 35 of the field facet mirror 19. The control device 35 is in particular configured for common line-by-line, i.e. row-by-row or column-by-column, actuation of the individual mirrors 27. An individual actuation of the individual mirrors 27 is also possible within the individual mirror rows 29 and the individual mirror columns 30.

Each of the individual mirrors 27 can, individually and independently, be tilted about two tilt axes which are perpendicular to one another, wherein a first one of these tilt axes extends parallel to the x-axis and the second one of these two tilt axes extends parallel to the y-axis. Tilt axes parallel to the two main directions of extent HRα, HRβ are also possible. The two tilt axes lie in the individual reflection surfaces of the respective individual mirrors 27.

Additionally, the actuators 31 also render it possible to displace the individual mirrors 27 individually in the z-direction. Thus, the individual mirrors 27 can be displaced in an actuatable manner separately from one another along a normal to the reflection surface of the field facet mirror 19. As a result, it is possible to change the topography of the reflection surface of the field facet mirror 19 or of the respective mirror array 26 overall. This is illustrated in an exemplary and very schematic fashion on the basis of FIGS. 4 to 6. As a result, it is also possible to manufacture contours of the reflection surface with large sag, i.e. large variations in the topography of the reflection surface, in the form of mirror sections, arranged in a plane overall, in the style of Fresnel lenses. A basic curvature of such a mirror surface topography with large sag is eliminated by such a subdivision into sections in the style of Fresnel zones.

Figure 4:
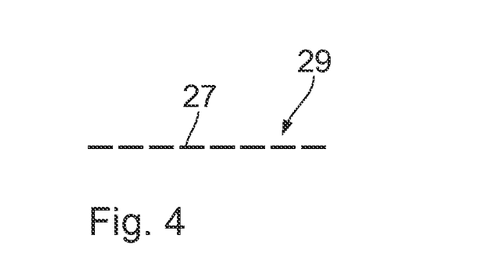
FIGS. 4 and 5 very schematically show, in two different configurations, different forms of a row reflection surface formed from the individual mirrors of the individual mirror row illustrated in FIG. 3.

FIG. 4 shows individual reflection surfaces of the individual mirrors 27 of a section of an individual mirror row 29, wherein all individual mirrors 27 of this individual mirror row 29 are set to the same absolute z-position by the control device 35 and the actuators 31. This results in a planar row reflection surface of the individual mirror row 29. If all individual mirrors 27 of the field facet mirror 19 are aligned in accordance with FIG. 4, the whole reflection surface of the field facet mirror 19 is planar.

Figure 5:
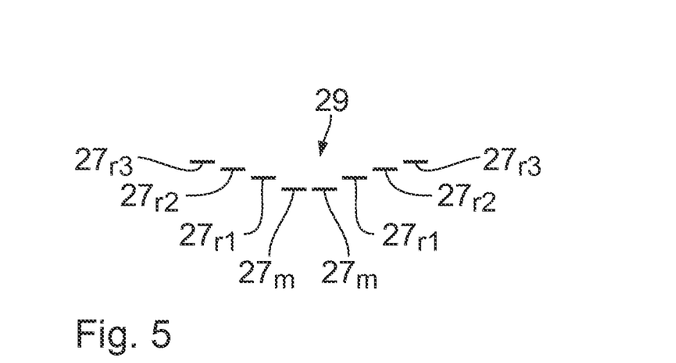

FIG. 5 shows an actuation of the individual mirrors 27 of the individual mirror row 29, in which the central individual mirror $27_m$ is set offset in the negative z-direction with respect to neighboring individual mirrors $27_{r1}$, $27_{r2}$, $27_{r3}$. The result of this is a stepped arrangement, which leads to a corresponding phase offset of the EUV radiation 16 incident on the individual mirror row 29 according to FIG. 5. The EUV radiation 16 reflected by the two central individual mirrors $27_m$ experiences the greatest phase retardation here. The edge-side individual mirrors $27_{r3}$ generate the least phase retardation. The intermediate individual mirrors $27_{r1}$, $27_{r2}$ generate, correspondingly step-wise, increasingly less phase retardation proceeding from the phase retardation by the central individual mirrors $27_m$.

Figure 6:
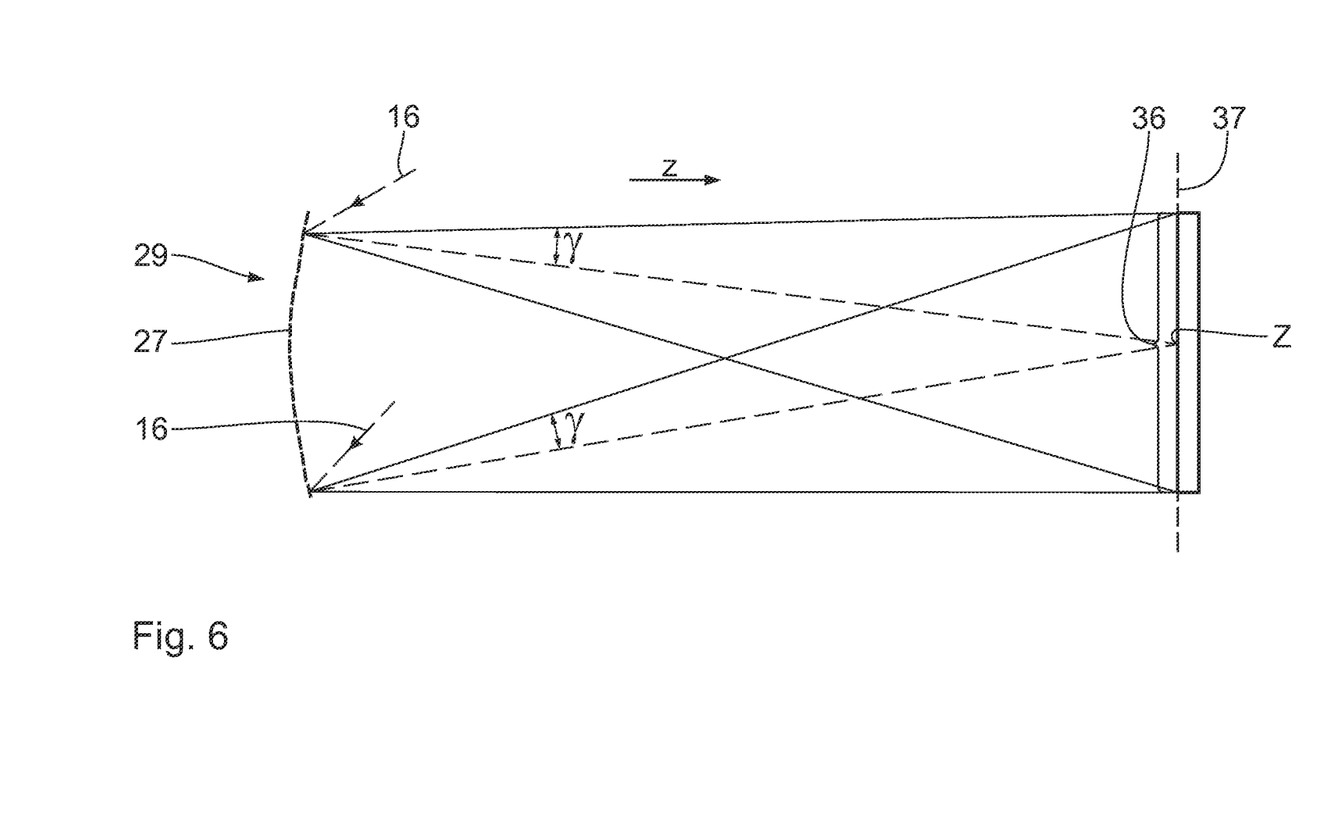
FIG. 6 shows a further configuration of the individual mirror row, wherein reflected illumination light rays over a possible tilt angle region of two selected individual mirrors are illustrated.

FIG. 6 shows an arrangement of the individual mirrors 27 of the illustrated section of the individual mirror row 29 in such a way that this results overall in a concavely shaped main alignment of the individual mirror row 29 as a result of, firstly, an offset of the individual mirrors 27 with respect to one another in the z-direction and, secondly, an orientation of the individual mirrors 27 with respect to one another. The individual mirrors 27 of the individual mirror row 29 therefore form a group reflection surface which is curved overall.

The beam profile of two individual rays of the illumination light 16 in the case of the reflection at two of the individual mirrors 27 is illustrated in a dashed and exemplary fashion in FIG. 6, which individual mirrors are present with the main alignment, i.e. in an untilted neutral position. Thus, when untilted, these two individual mirrors 27 reflect the incident illumination light 16 to a center Z of a region 36, to be illuminated by the individual mirror row 29, in an arrangement plane 37 of the pupil facet mirror 20. The full rows in FIG. 6 illustrate how the reflection angle of the two individual rays of the illumination light 16 changes when the two individual mirrors 27 are present tilted about their respective maximum tilt angle γ. Here, the reflected individual rays of the illumination light 16 sweep over the whole illumination region 36. The concavely curved design of the individual mirror row 29 therefore ensures that, in the case of a small required maximum tilt angle γ for all individual mirrors 27, the whole illumination region 36 can be illuminated by all individual mirrors 27 of the individual mirror row 29.

A convex arrangement of groups of the individual mirrors 27, for example, is naturally also possible in the same way.

Corresponding shapings, as explained above with reference to FIGS. 4 to 6, are not restricted to the row dimension HRβ but can, depending on the actuation via the control device 33, also be used over the column dimension HRα of the mirror arrays 26 or of the whole field facet mirror 19.

As a result of the individual actuation of the actuators 31 via the control device 35, a predetermined tilt grouping of the individual mirrors 27 into the individual mirror groups 25, already mentioned above, respectively made up of at least two individual mirrors 27 can be set, which will be explained in more detail below on the basis of FIG. 7. Via respectively at least one own group mirror illumination channel 37 for the illumination light 16, the individual mirror groups 25 are respectively associated with at least one own pupil facet 38 of the pupil facet mirror 20 for imaging the individual mirror group 25 into the object field 5. This association is brought about by predetermining a main alignment and/or the respective tilt position or switch position of the individual mirrors 27 belonging to the individual mirror group 25. Here, the group mirror illumination channel 37 is the totality of all individual mirror illumination channels of the respective individual mirror group 25, which complement one another to illuminate the whole illumination or object field 5 as a result of imaging via the pupil facet 38. Each of the individual mirror groups 25 can therefore be considered to be the original image of the illumination field 5. The overall illumination of the illumination or object field 5 then constitutes a superposition of these original images.

Figure 7:
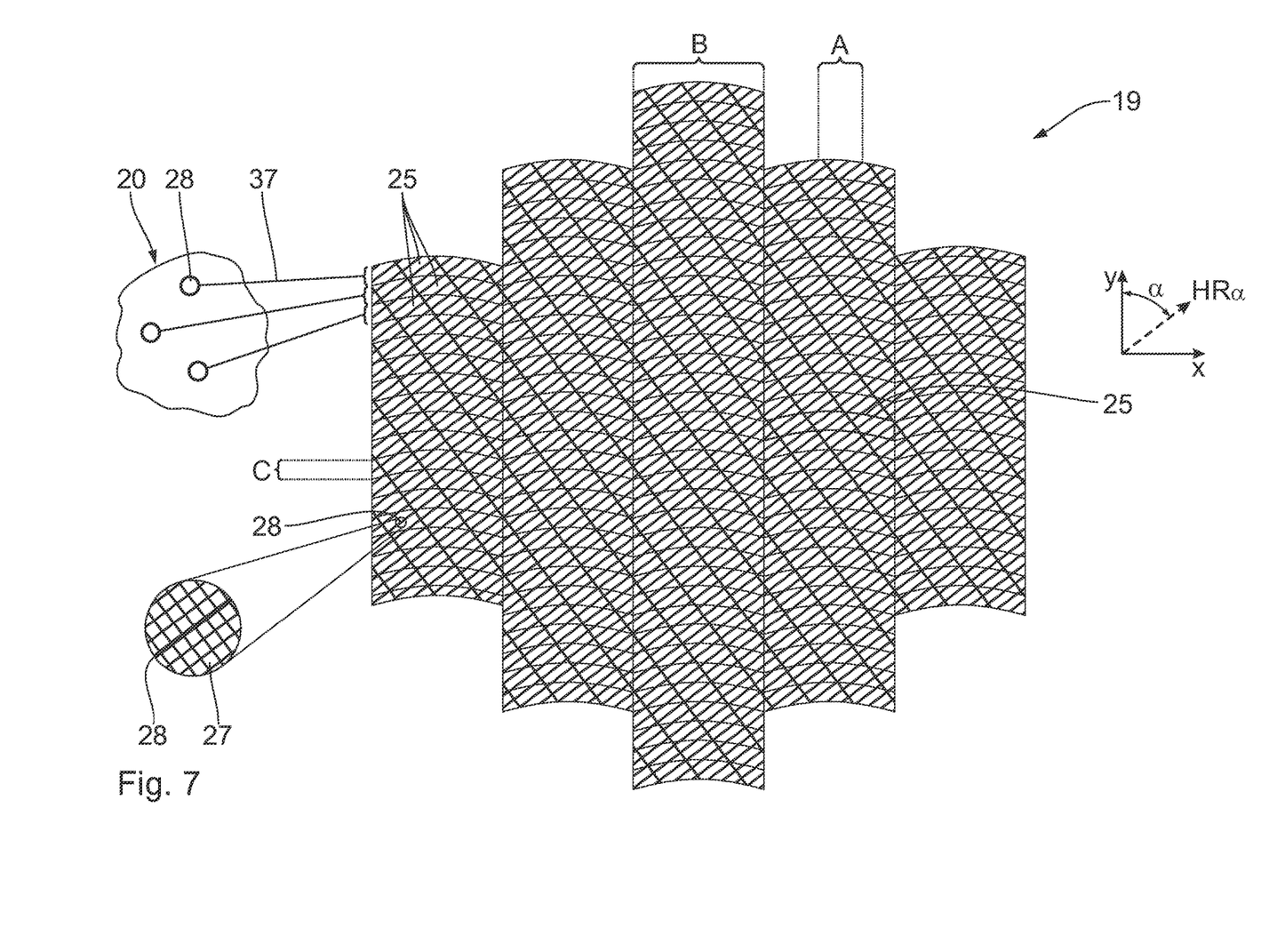
FIG. 7 shows a top view of a section of an embodiment of a field facet mirror made up of individual mirrors, with an exemplary grouping of the individual mirrors into an arrangement of individual mirror groups, wherein, in exemplary fashion, an assignment of some of the individual mirror groups to second facets of a second facet mirror, likewise illustrated in a top view to the left-hand side in FIG. 7, via group mirror illumination channels is also indicated.

FIG. 7 clarifies such a grouping. The whole reflection surface of the field facet mirror 19 is illustrated. Components corresponding to those which have already been explained above with reference to FIGS. 2 to 6 are denoted by the same reference signs and will not be discussed again individually.

In the x-direction, i.e. perpendicular to the object displacement direction y, the reflection surface of each of the individual mirror groups 25 has an extent of B. In the y-direction, the reflection surface of each of the individual mirror groups 25 has an extent of C. The individual mirror groups 25 (see FIG. 7) have typical x/y extents of 25 mm×4 mm or of 104 mm×8 mm, i.e. an x/y aspect ratio of 13/1. Depending on the ratio between the size of the respective individual mirror groups 25 and the size of the individual mirrors 27, which make up these individual mirror groups 25, each of the individual mirror groups 25 has an appropriate number of individual mirrors 27.

Within each of the individual mirror groups 25, the individual mirrors 27 are aligned with respect to one another in such a way that the shape of each of the individual mirror groups 25 corresponds to the shape of an individual field facet of a conventional field facet mirror. The images of the individual mirrors 27 of the respective individual mirror group 25 complement one another in the object field 5 to form the whole object field 5.

Thus, respectively one of the individual mirror groups 25 has the function of a facet of a field facet mirror, as is disclosed in, for example, U.S. Pat. No. 6,438,199 B1 or U.S. Pat. No. 6,658,084 B2. Here, the individual mirror groups 25 correspond to curved field facets. One of the individual mirrors 27 belongs to an individual mirror group 25 precisely if at least 50% of the reflection surface of the individual mirror 27 lies within the boundary of the respective individual mirror group 25 prescribed by the curved contouring.

The curved edge contours of the individual mirror groups 25 respectively have the same x/y aspect ratio. Each of the individual mirror groups 25 consists of a multiplicity of individual mirrors 27, which respectively belong to a plurality of mirror arrays 26. The extent B of the individual mirror groups 25 perpendicular to the object displacement direction or scanning direction y is not an integer multiple of the extent A of the mirror arrays 26 perpendicular to the scanning direction y. That is to say, the following applies:

$$B \neq kA,$$

where k is an integer.

As a result of an appropriate grouping of the actuations by the control device 35, five columns of individual mirror groups 25 are formed in the example in FIG. 7. In this case, a central column contains more than forty individual mirror groups 25, which lie directly next to one another in the y-direction. The two outer group columns contain more than twenty individual mirror groups and the intermediate group columns contain more than thirty individual mirror groups such that, overall, the field facet mirror 19 has more than one hundred and forty individual mirror groups 25.

FIG. 7 once again illustrates the angular relationship between the main direction HRα and the object displacement direction y.

FIG. 7 schematically shows an assignment of three of the individual mirror groups 25 to three pupil facets 38 of the pupil facet mirror 20 via the group mirror illumination channels 37.

Figure 8:
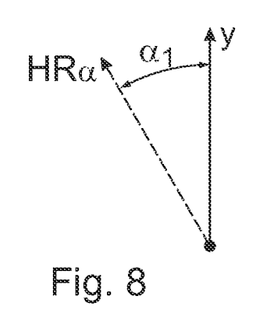
FIGS. 8 to 10 show further variants of an angle between the main direction HRα of the gaps between neighboring ones of the mirror arrays and the displacement direction.
Figure 9:
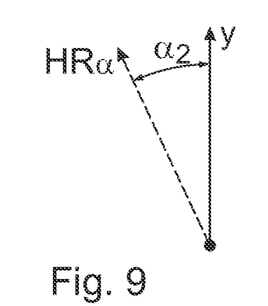
Figure 10:
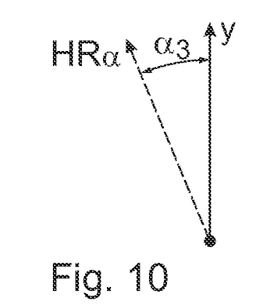

FIGS. 8 to 10 show further variants of smallest angles between the main direction HRα, i.e. the direction of extent of the gaps 28 between neighboring ones of the mirror arrays 26, and the object displacement direction y.

In the embodiment according to FIG. 8, this angle $\alpha_1$ is 30°±2°. In the variant according to FIG. 9, this angle $\alpha_2$ is 25°±2°. In the variant according to FIG. 10, this angle $\alpha_3$ is 22.5°±10°. Other angles between the main direction HRα and the object displacement direction y in the range between 20° and 44° are also possible, in particular angles in the range between 30° and 44° or between 35° and 40°.

During the projection exposure with the aid of the projection exposure apparatus 1, at least part of the reticle 7 in the object field 5 is imaged onto a region of the light-sensitive layer on the wafer 13 in the image field 11 for the purposes of the lithographic production of a microstructured or nanostructured component, in particular a semiconductor component, for example a microchip. In the process, the reticle 7 and the wafer 13 are, during scanner operation, continuously displaced in the y-direction in a temporally synchronized fashion.

The invention claimed is:

1. An assembly, comprising:
   an illumination optical unit configured to guide illumination light to an illumination field, the illumination optical unit comprising:
      a first facet mirror comprising a plurality of mirror arrays arranged in an array superstructure, gaps extending along a main direction between neighboring mirror arrays, and each mirror array comprising a plurality of individual mirrors configured to provide individual mirror illumination channels to guide illumination light partial beams to the illumination field; and
      a second facet mirror downstream of the first facet mirror in a beam path of the illumination light through the illumination optical unit, the second facet mirror comprising a plurality of facets, each facet of the second facet mirror configured to contribute to imaging a group of the individual mirrors of the first facet mirror into the illumination field via a group mirror illumination channel, images of the individual mirrors of the first facet mirror complementing each other in the illumination field to form the whole illumination field; and
   a projection optical unit configured to image an object field into an image field,
   wherein:
      the object field is arranged in the illumination field;
      the projection optical unit comprises an object holder and a displacement drive;
      the object holder is configured to hold a lithography mask in the object field;
      the displacement drive is configured to displace the object holder along a displacement direction;
      a smallest angle between the main direction and the displacement direction is between 20° and 44°; and
      the assembly is an EUV projection exposure assembly.

2. The assembly of claim 1, wherein the smallest angle between the main direction and the displacement direction is between 30° and 44°.

3. The assembly of claim 1, wherein the smallest angle between the main direction and the displacement direction is between 35° and 40°.

4. The assembly of claim 1, wherein the smallest angle between the main direction and the displacement direction is 37°.

5. The assembly of claim 1, wherein an extent of the group of individual mirrors perpendicular to a scanning direction is not an integer multiple of a maximum extent of the mirror arrays perpendicular to the scanning direction.

6. The assembly of claim 1, wherein the individual mirrors of one of the individual mirror groups are tiltable and configured so that they form an overall curved group reflection surface in an untilted neutral position.

7. An apparatus, comprising:
   an assembly according to claim 1; and
   an EUV light source,
   wherein the apparatus is an EUV projection exposure apparatus.

8. The apparatus of claim 7, further comprising a wafer displacement drive and a wafer holder, wherein the wafer holder is configured to hold a wafer in the image field, and the wafer displacement drive is configured to displace the wafer holder in the displacement direction.

9. The apparatus of claim 7, wherein the smallest angle between the main direction and the displacement direction is between 30° and 44°.

10. The apparatus of claim 7, wherein the smallest angle between the main direction and the displacement direction is between 35° and 40°.

11. The apparatus of claim 7, wherein the smallest angle between the main direction and the displacement direction is 37°.

12. The apparatus of claim 7, wherein an extent of the group of individual mirrors perpendicular to a scanning direction is not an integer multiple of a maximum extent of the mirror arrays perpendicular to the scanning direction.

13. The apparatus of claim 7, wherein the individual mirrors of one of the individual mirror groups are tiltable and configured so that they form an overall curved group reflection surface in an untilted neutral position.

14. A method, comprising:
   providing the assembly of claim 1;
   using the illumination optical unit to illuminate at least some structures of a reticle in an illumination field of the illumination optical unit; and
   using the projection optical unit to project at least some of the illuminated structures of the wafer onto a region of the wafer in an image field of the projection optical unit.

15. An assembly, comprising:
   an illumination optical unit configured to guide illumination light to an illumination field, the illumination optical unit comprising:
      a first facet mirror comprising a plurality of mirror arrays arranged in an array superstructure, gaps extending along a main direction between neighboring mirror arrays, and each mirror array comprising a plurality of individual mirrors configured to provide individual mirror illumination channels to guide illumination light partial beams to the illumination field; and a second facet mirror downstream of the first facet mirror in a beam path of the illumination light through the illumination optical unit, the second facet mirror comprising a plurality of facets, each facet of the second facet mirror contributing to imaging a group of the individual mirrors of the first facet mirror into the illumination field via a group mirror illumination channel, images of the individual mirrors of the first facet mirror complementing each other in the illumination field to form the whole illumination field; and a projection optical unit configured to image an object in an object field into an image field, wherein:
- the object field is arranged in the illumination field;
- the object is displaceable in a displacement direction;
- a smallest angle between the main direction and the displacement direction is between 20° and 44°; and
- the assembly is an EUV projection exposure assembly.

16. The assembly of claim 15, wherein the smallest angle between the main direction and the displacement direction is between 30° and 44°.

17. The assembly of claim 15, wherein the smallest angle between the main direction and the displacement direction is between 35° and 40°.

18. The assembly of claim 15, wherein the smallest angle between the main direction and the displacement direction is 37°.

19. An apparatus, comprising:
an assembly according to claim 15; and
an EUV light source,
wherein the apparatus is an EUV projection exposure apparatus.

20. A method, comprising:
providing the assembly of claim 15;
using the illumination optical unit to illuminate at least some structures of a reticle in an illumination field of the illumination optical unit; and
using the projection optical unit to project at least some of the illuminated structures of the wafer onto a region of the wafer in an image field of the projection optical unit.

* * * * *

UNITED STATES PATENT AND TRADEMARK OFFICE
CERTIFICATE OF CORRECTION

PATENT NO. : 9,791,784 B2
APPLICATION NO. : 14/516250
DATED : October 17, 2017
INVENTOR(S) : Michael Patra et al.

It is certified that error appears in the above-identified patent and that said Letters Patent is hereby corrected as shown below:

In the Specification

Column 2, Line 19, delete "44°.This" and insert -- 44°. This --.

Signed and Sealed this
Nineteenth Day of December, 2017

Joseph Matal
*Performing the Functions and Duties of the*
*Under Secretary of Commerce for Intellectual Property and*
*Director of the United States Patent and Trademark Office*